United States Patent
Park et al.

(10) Patent No.: US 10,453,790 B2
(45) Date of Patent: Oct. 22, 2019

(54) SEMICONDUCTOR PACKAGE

(71) Applicant: SAMSUNG ELECTRONICS CO., LTD., Suwon-si (KR)

(72) Inventors: Chang Hwa Park, Suwon-Si (KR); Ichiro Ogura, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/989,564

(22) Filed: May 25, 2018

(65) Prior Publication Data

US 2019/0122977 A1  Apr. 25, 2019

(30) Foreign Application Priority Data

Oct. 19, 2017 (KR) .................. 10-2017-0136062

(51) Int. Cl.
*H01L 23/31* (2006.01)
*H01L 23/498* (2006.01)
*H01L 23/00* (2006.01)

(52) U.S. Cl.
CPC .. *H01L 23/49894* (2013.01); *H01L 23/49822* (2013.01); *H01L 23/49827* (2013.01);
(Continued)

(58) Field of Classification Search
CPC ....... H01L 23/564; H01L 23/00; H01L 23/31; H01L 23/49; H01L 23/498; H01L 23/49894; H01L 23/49822; H01L 23/49827; H01L 23/3128; H01L 23/49838; H01L 23/49866; H01L 23/49811;
(Continued)

(56) References Cited

U.S. PATENT DOCUMENTS 9,520,372 B1* 12/2016 Jeng .................. H01L 21/02164
2005/0074963 A1* 4/2005 Fujii ..................... G02F 1/1368
438/623
(Continued)

FOREIGN PATENT DOCUMENTS

JP  2005-222860 A  8/2005
JP  2017-073554 A  4/2017
(Continued)

OTHER PUBLICATIONS

Korean Office Action issued in corresponding Korean Patent Application No. 10-2017-0136062, dated Jul. 27, 2018, with English Translation.
(Continued)

*Primary Examiner* — Chuong A Luu
(74) *Attorney, Agent, or Firm* — Sughrue Mion, PLLC

(57) ABSTRACT

A semiconductor package includes: a semiconductor chip having connection pads; a connection member having a first surface on which the semiconductor chip is disposed and a second surface opposing the first surface and including an insulating member and a redistribution layer formed on the insulating member and electrically connected to the connection pads; an encapsulant disposed on the first surface of the connection member and encapsulating the semiconductor chip; and a barrier layer disposed on the second surface of the connection member and including an organic layer containing fluorine.

14 Claims, 13 Drawing Sheets

(52) U.S. Cl.
CPC ............ *H01L 23/564* (2013.01); *H01L 24/18* (2013.01); *H01L 23/3128* (2013.01); *H01L 2224/18* (2013.01)

(58) Field of Classification Search
CPC ......... H01L 24/11; H01L 24/82; H01L 24/18; H01L 24/81
USPC ........................................................ 257/668
See application file for complete search history.

(56) References Cited

U.S. PATENT DOCUMENTS

| | | |
|---|---|---|
| 2005/0180721 A1 | 8/2005 | Hayashi et al. |
| 2011/0199564 A1 | 8/2011 | Moriwaki |
| 2012/0125431 A1 | 5/2012 | Oizumi et al. |
| 2014/0103527 A1 | 4/2014 | Marimuthu et al. |
| 2014/0196771 A1 | 7/2014 | Auvray et al. |
| 2015/0279774 A1 | 10/2015 | Kleksov et al. |
| 2016/0027747 A1* | 1/2016 | Ryu ........................ H01L 24/05 257/737 |
| 2017/0103951 A1 | 4/2017 | Lee et al. |
| 2017/0317312 A1* | 11/2017 | Cho .................... H01L 51/5253 |

FOREIGN PATENT DOCUMENTS

| | | |
|---|---|---|
| KR | 10-2017-0010708 A | 2/2017 |
| KR | 10-2017-0043440 A | 4/2017 |
| TW | 201543615 A | 11/2015 |
| TW | 201705358 A | 2/2017 |
| WO | 2010/038514 A1 | 4/2010 |
| WO | 2010/150759 A1 | 12/2010 |

OTHER PUBLICATIONS

Taiwanese Office Action dated Jan. 9, 2019 issued in Taiwanese Patent Application No. 107118016 (with English translation).

* cited by examiner

SEMICONDUCTOR PACKAGE

CROSS-REFERENCE TO RELATED APPLICATION(S)

This application claims the benefit of priority to Korean Patent Application No. 10-2017-0136062, filed on Oct. 19, 2017 in the Korean Intellectual Property Office, the disclosure of which is incorporated herein by reference in its entirety.

BACKGROUND

1. Field

The present disclosure relates to a semiconductor package.

2. Description of Related Art

Semiconductor packages have been continuously required to be thinned and lightened in terms of a shape, and have been required to be implemented in a system in package (SiP) form requiring complexation and multi-functionality in terms of a function. In accordance with such a development trend, a fan-out wafer level package (FOWLP) has been recently prominent, and attempts to satisfy requirements of semiconductor packaging by applying several techniques to the FOWLP have been conducted.

For the purpose of thinness and lightness of the semiconductor packages, reductions of both a thickness of a circuit pattern transferring an electrical signal and a thickness of an insulating layer covering the circuit pattern have been demanded. In accordance with the reduction in the thickness of the insulating layer, it has been more difficult to satisfy reliability regarding such features such as close adhesion, chemical resistance, heat resistance, moisture permeability, and the like.

SUMMARY

An aspect of the present disclosure may provide a semiconductor package in which a cause of a reliability decrease such as corrosion of a circuit pattern may be solved by improving water vapor permeability and gas permeability of an insulating member.

According to an aspect of the present disclosure, a semiconductor package may be provided, in which a new barrier layer is introduced onto a surface of an insulating member for a redistribution structure in order to improve reliability of the semiconductor package.

According to an aspect of the present disclosure, a semiconductor package may include: a semiconductor chip having connection pads; a connection member having a first surface on which the semiconductor chip is disposed and a second surface opposing the first surface and including an insulating member and a redistribution layer disposed in the insulating member and electrically connected to the connection pads; an encapsulant disposed on the first surface of the connection member and encapsulating the semiconductor chip; and a barrier layer disposed on the second surface of the connection member and including an organic layer containing fluorine.

According to another aspect of the present disclosure, a semiconductor package may include: a semiconductor chip having connection pads; a connection member having a first surface on which the semiconductor chip is disposed and a second surface opposing the first surface and including an insulating member, a redistribution layer disposed in the insulating member and electrically connected to the connection pads, and a UBM layer connected to the redistribution layer and providing connection regions on the second surface; an encapsulant disposed on the first surface of the connection member and encapsulating the semiconductor chip; electrical connection structures disposed on the second surface of the connection member and connected to the connection regions of the UBM layer; and a multilayer barrier having an organic layer disposed on the second surface of the connection member and an inorganic layer disposed on the organic layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
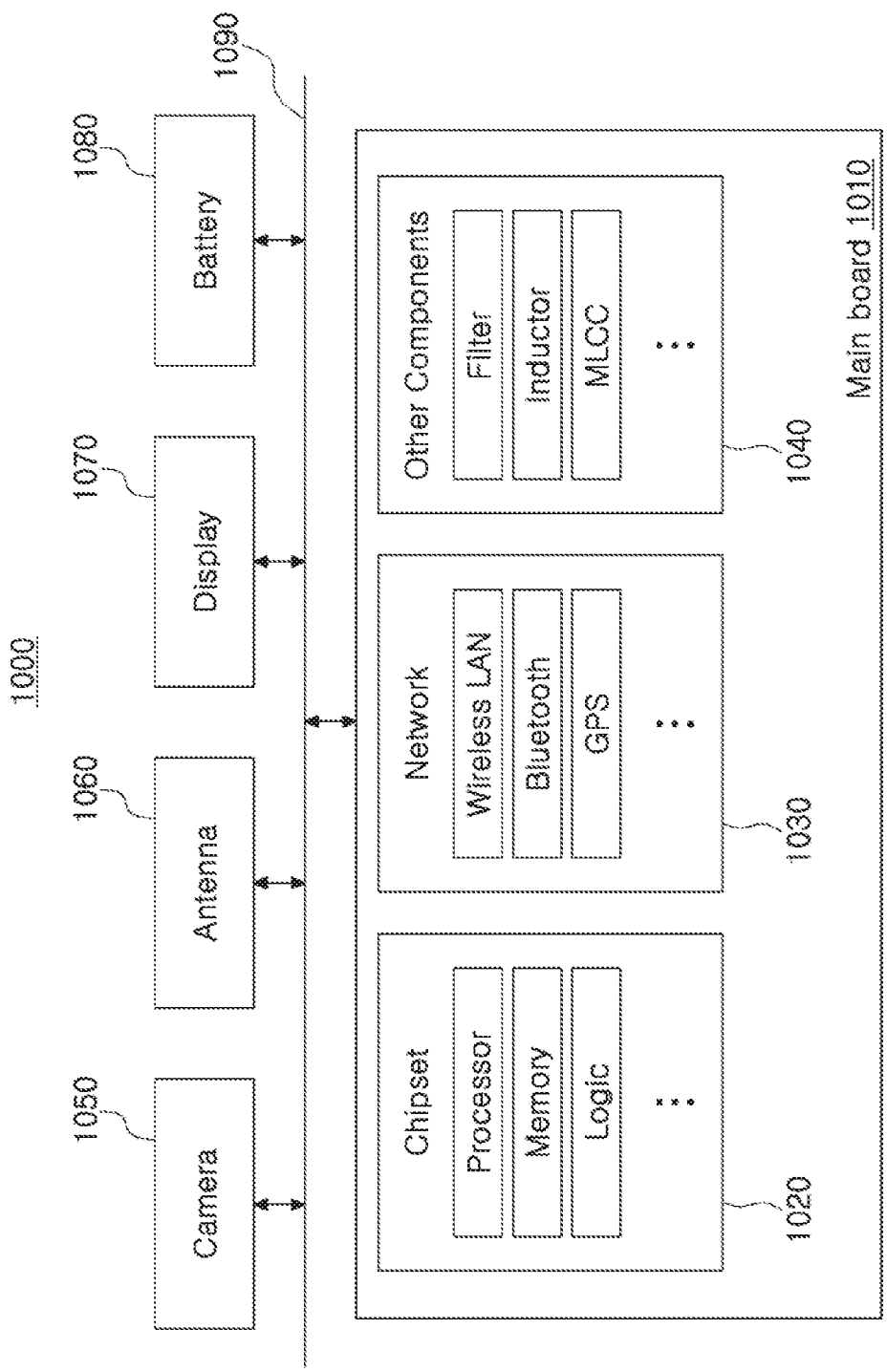
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, but may also include other types of chip related components. In addition, the chip-related components 1020 may be combined with each other.

The network-related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network-related components 1030 are not limited thereto, but may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
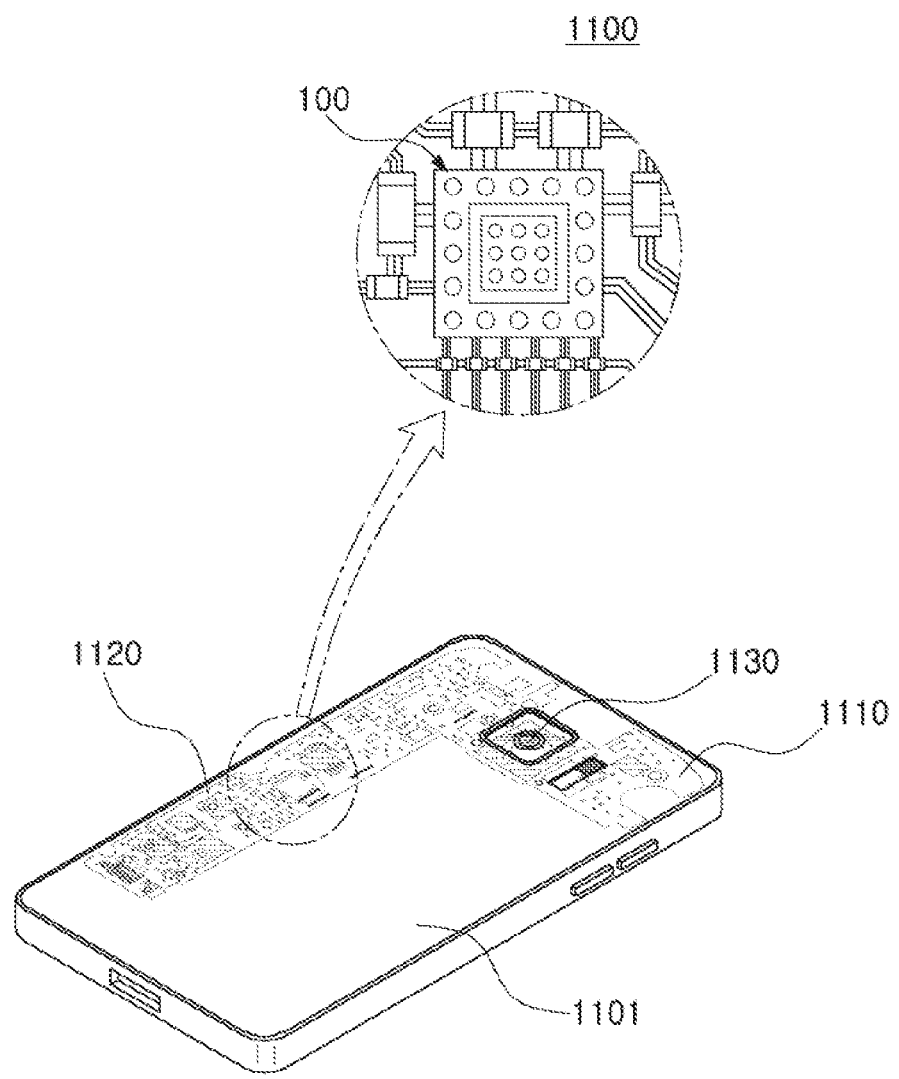
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

Semiconductor packaging is required because there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
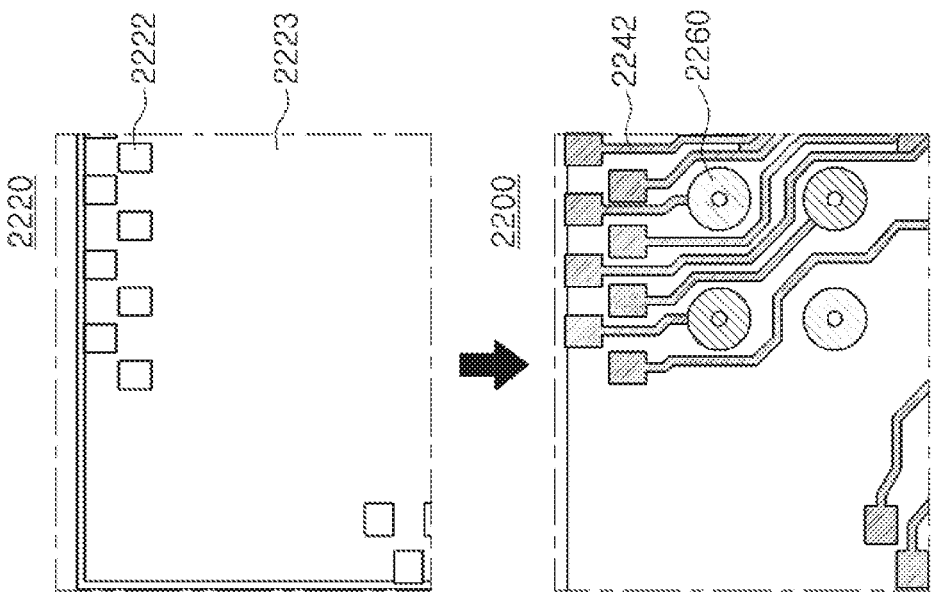
FIGS. 3A and 3B are schematic cross-sectional views illustrating states of a fan-in semiconductor package before and after being packaged.
Figure 3A:
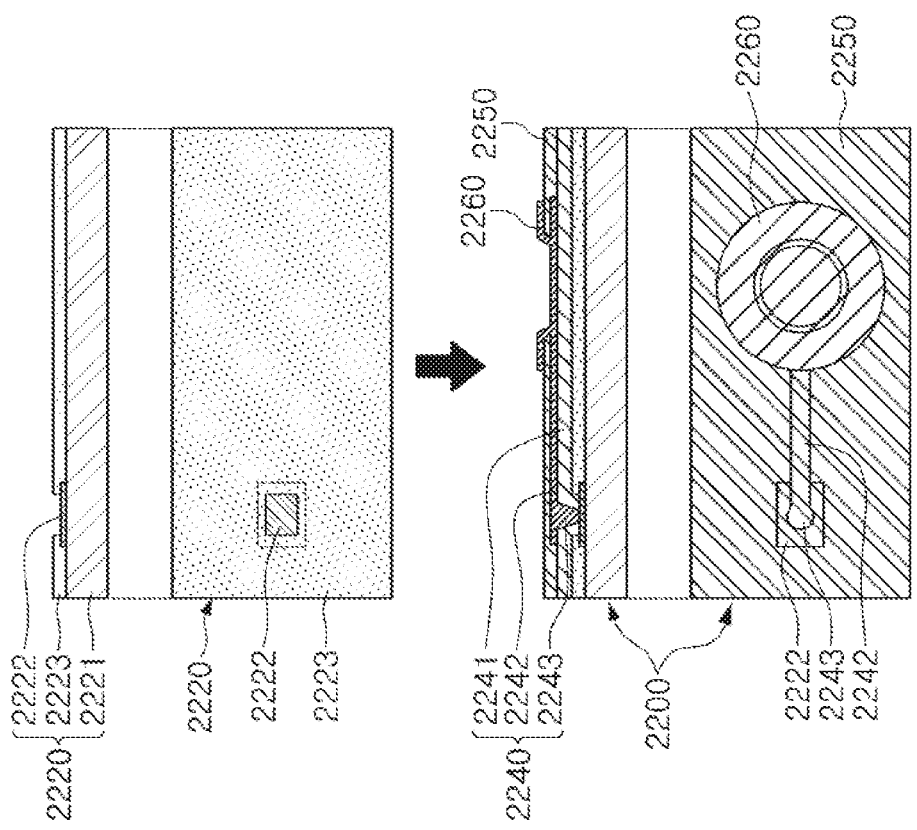
Figure 4:
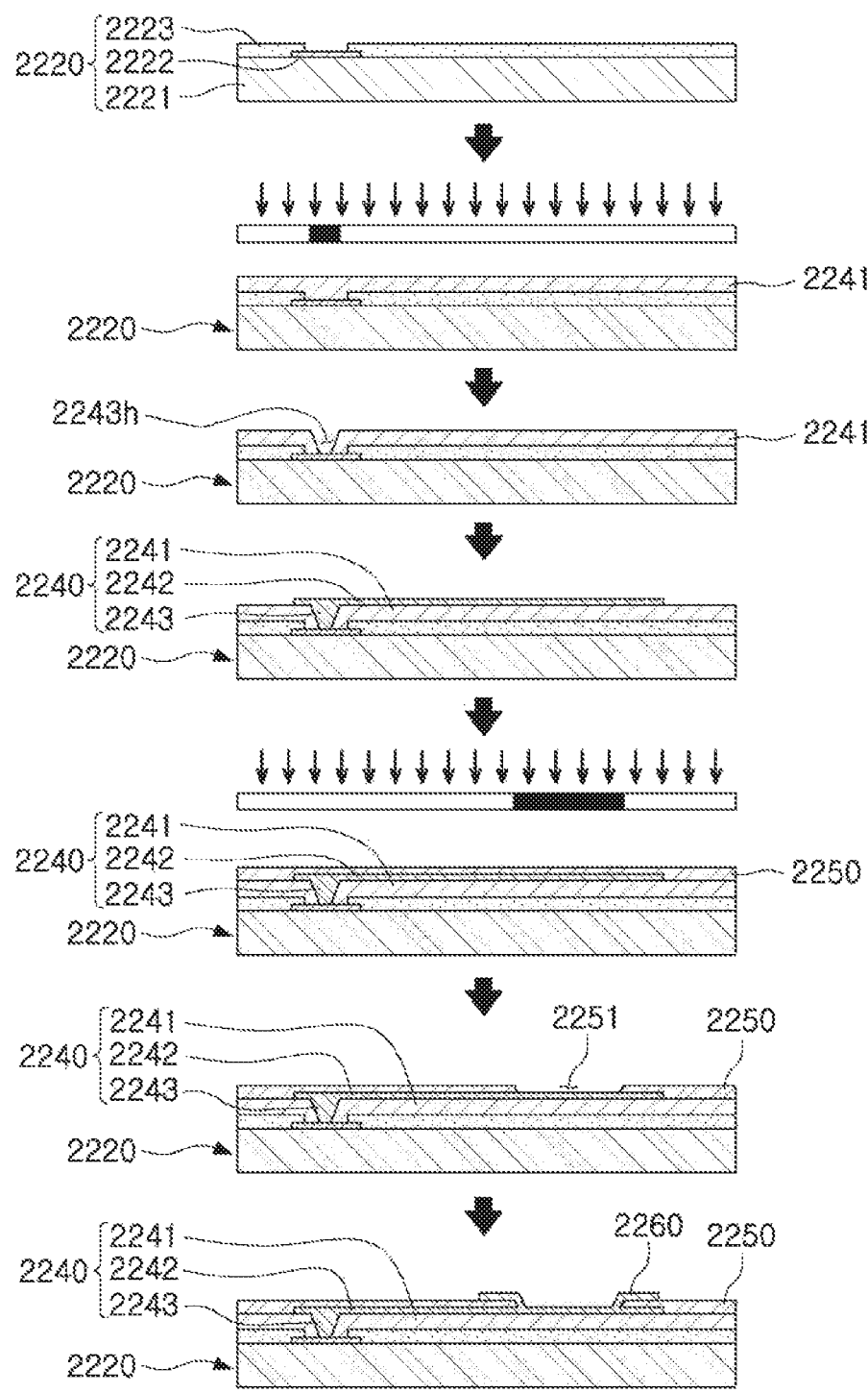
FIG. 4 is schematic cross-sectional views illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3A through 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
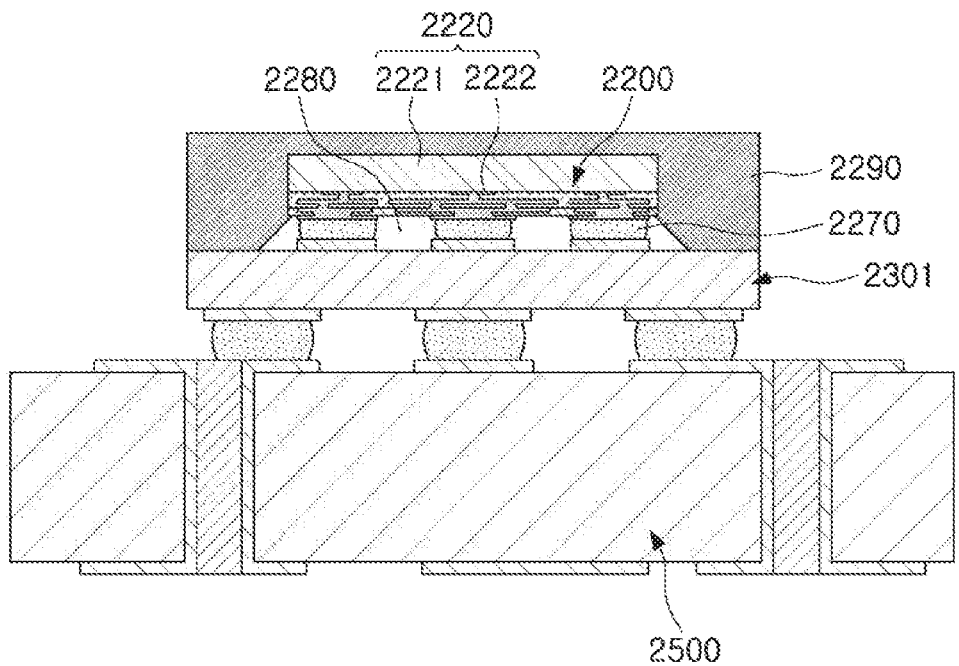
FIG. 5 is a schematic cross-sectional view illustrating a case in which a fan-in semiconductor package is mounted on an interposer substrate and is ultimately mounted on a mainboard of an electronic device.
Figure 6:
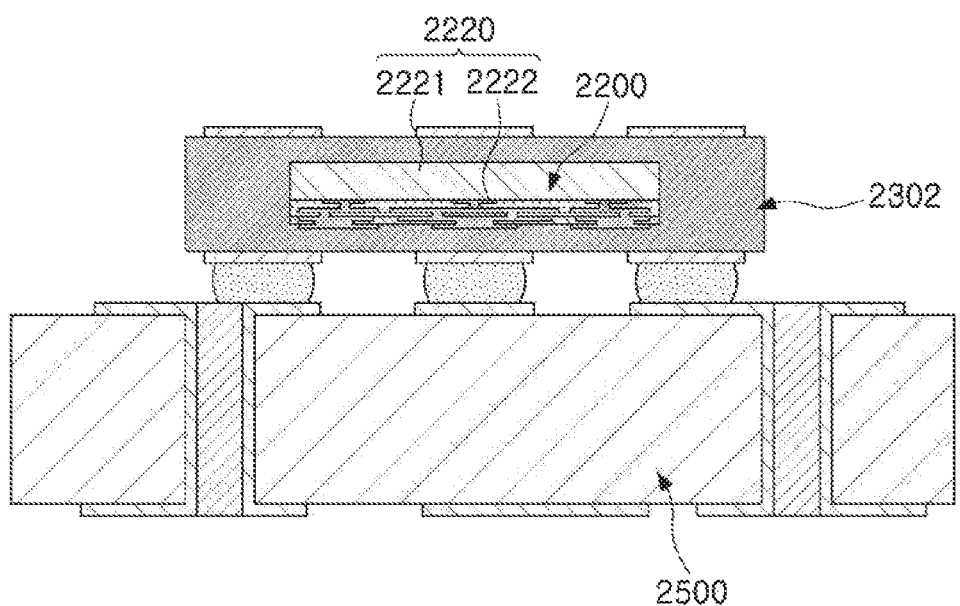
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
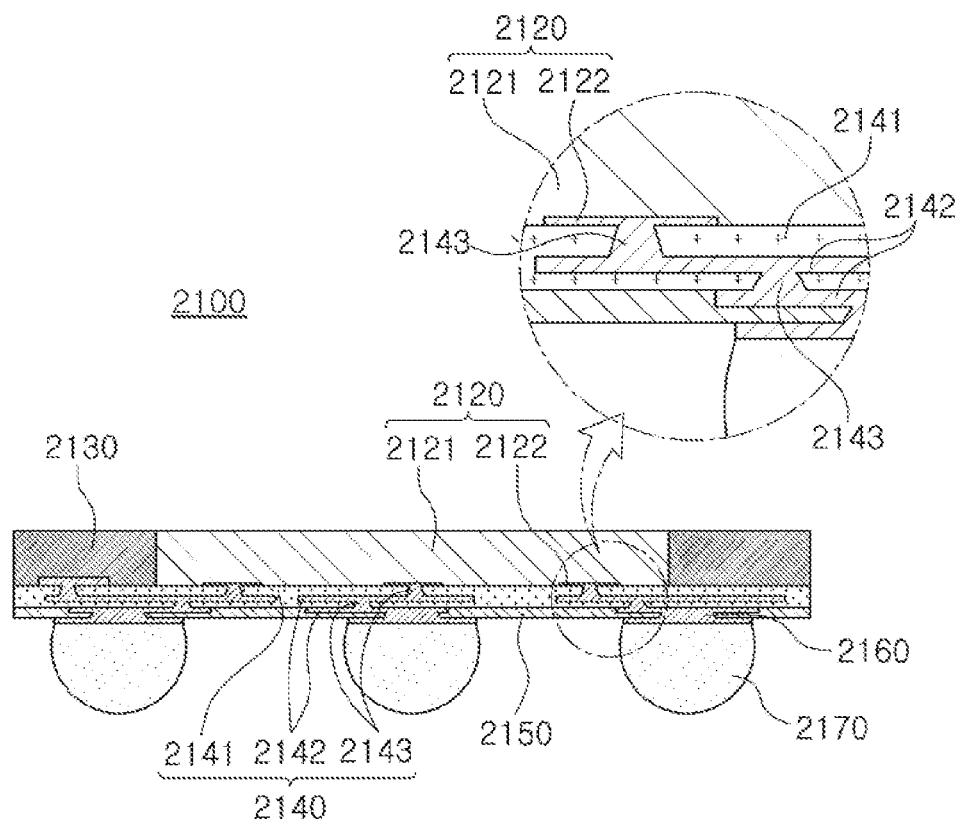
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for the connection member 2140 is performed from the via connecting the redistribution layers and the connection pads 2122 of the semiconductor chip 2120 to each other and the redistribution layers, and the vias 2143 may thus have a width that becomes small as they become to the semiconductor chip (see an enlarged region).

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
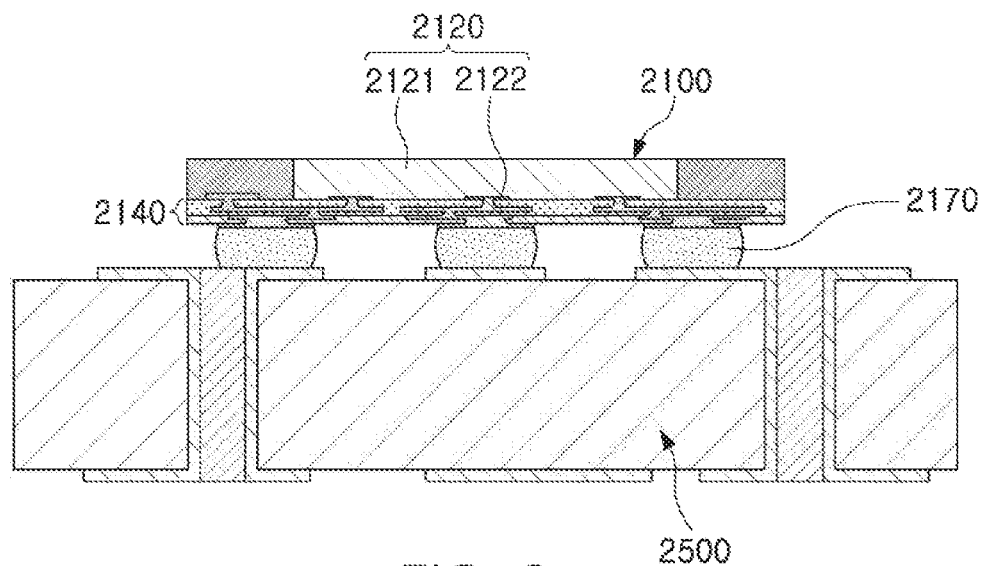
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

The fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A semiconductor chip in which high temperature/high humidity reliability is improved by forming a barrier layer capable of reducing penetration of water vapor and gas on a surface of an insulating member will hereinafter be described in detail with reference to the accompanying drawings.

Figure 9:
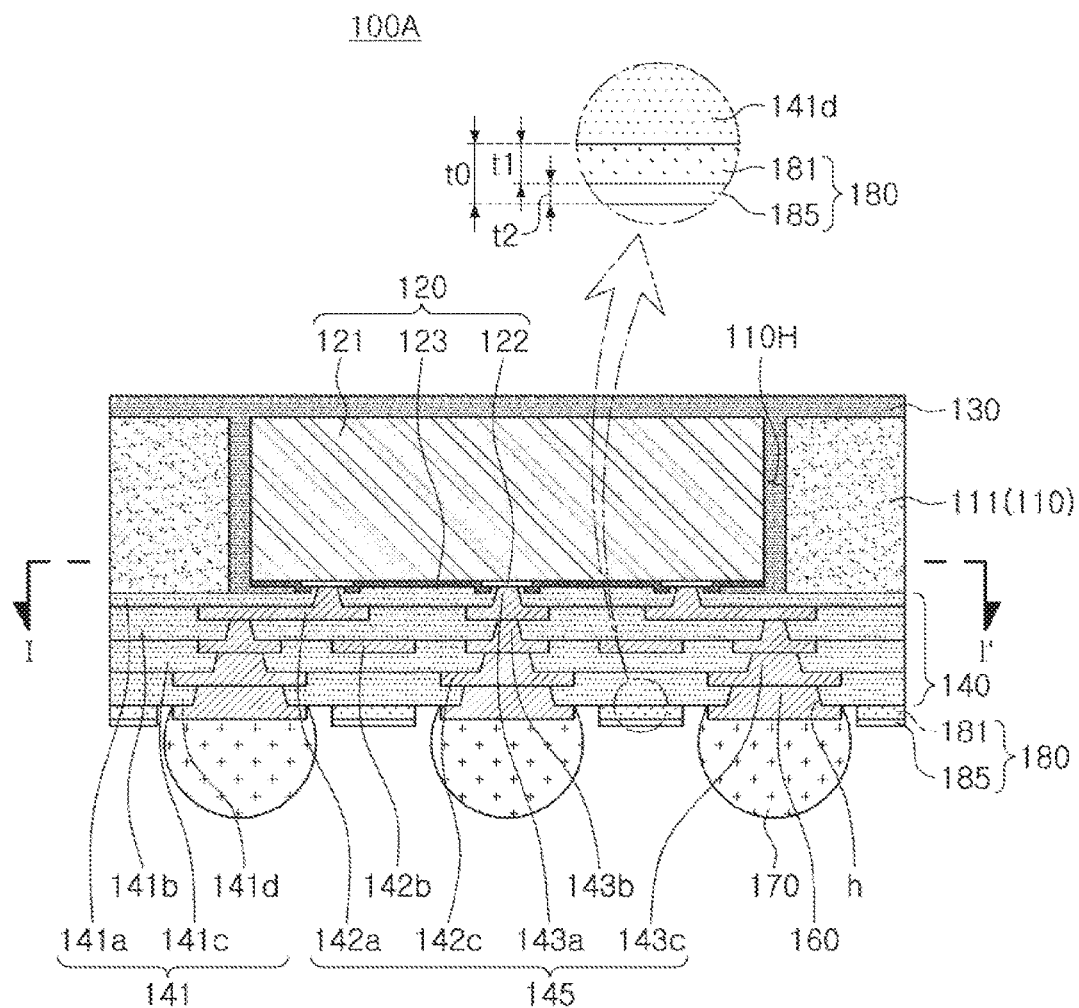
FIG. 9 is a side cross-sectional view illustrating a semiconductor package according to an exemplary embodiment in the present disclosure.
Figure 10A:
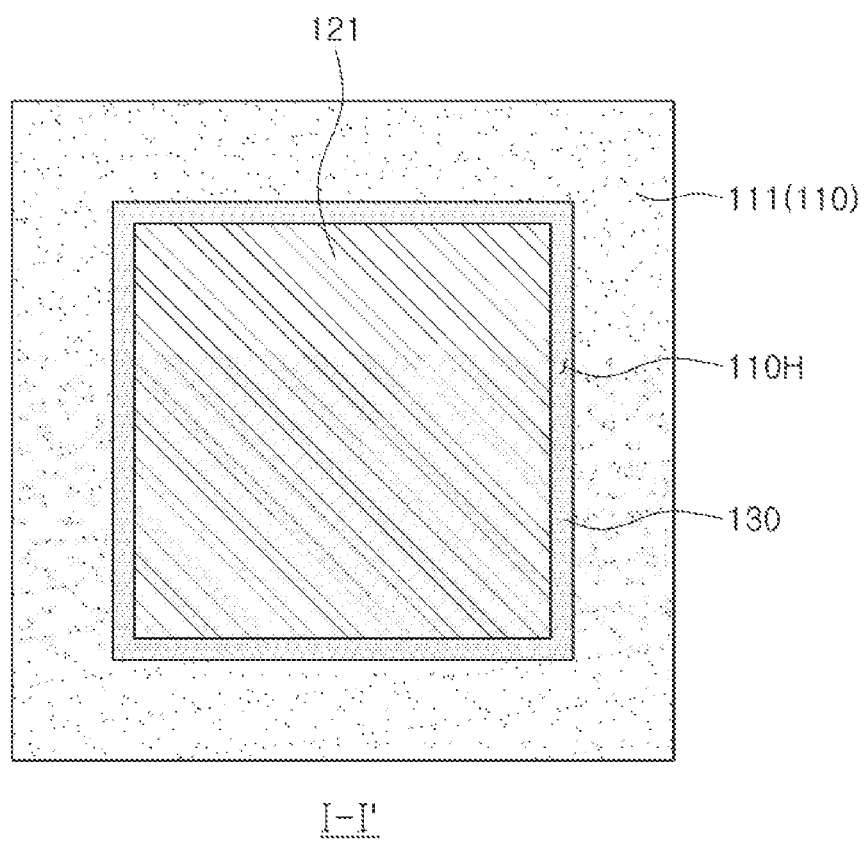
FIGS. 10A and 10B are, respectively, a plan view and a bottom view illustrating the semiconductor package illustrated in FIG. 9.
Figure 10B:
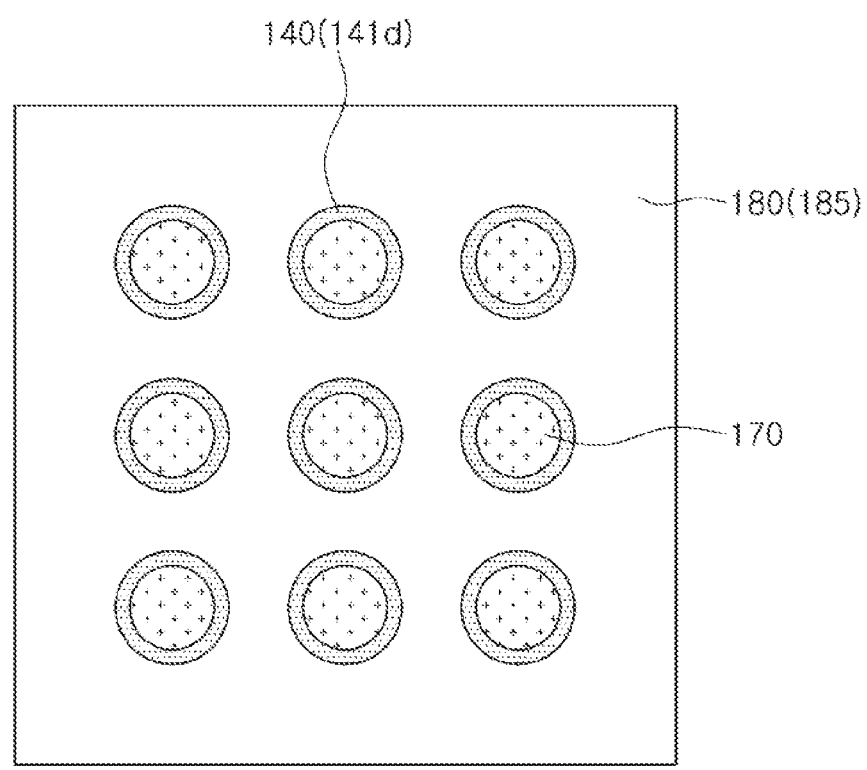

FIG. 9 is a side cross-sectional view illustrating a semiconductor package according to an exemplary embodiment in the present disclosure, and FIGS. 10A and 10B are, respectively, a plan view and a bottom view illustrating the semiconductor package illustrated in FIG. 9.

Referring to FIGS. 9 and 10A, a semiconductor package 100A according to the present exemplary embodiment may include a core member 110 having a cavity 110H, a connection member 140 having a first surface on which the core member 110 is disposed and a second surface opposing the first surface and including a redistribution layer 145, a semiconductor chip 120 disposed in the cavity 110H of the core member 110 and having connection pads 122 connected to the redistribution layer 145, and an encapsulant 130 encapsulating the core member 110 and the semiconductor chip 120.

As illustrated in FIG. 9, electrical connection structures 170 may be disposed on the second surface of the connection member 140. The connection member 100 may include underbump metallurgy (UBM) layers 160 connecting the electrical connection structures 170 and the redistribution layer 145 to each other.

A barrier layer 180 may be disposed on the second surface of the connection member 140. The barrier layer 180 may be disposed on the outermost surface of an insulating member 141, and may effectively prevent water vapor and gas (for example, oxygen) from internally permeating.

The barrier layer 180 used in the present exemplary embodiment may have a multilayer barrier structure including an organic layer 181 and an inorganic layer 185 disposed on the organic layer 181.

The organic layer 181 may be formed of an organic material containing fluorine. The inorganic layer 185 itself may serve to not only prevent permeation of the water vapor and the oxygen, but also to protect the organic layer 181 in a high temperature environment such as a reflow process.

For example, the organic layer 181 containing the fluorine may include at least one selected from the group consisting of $CF_4$, $C_4F_8$, and fluoroalkyl silane. The fluoroalkyl silane usable as a material of the organic layer 181 may include fluoroalkyl silane having one or more fluorine atoms and about 1 to about 12 carbon atoms, but is not limited thereto. For example, the organic layer 181 may include an organic material satisfying R—Si—$F_xC_yOH$. Here, a functional group represented by R may include alkyl, fluoroalkyl, acryl, methacryl, vinyl, epoxy, amine, and aniline groups, but is not limited thereto. In another example, the organic layer 181 may include perylene.

For example, the inorganic layer 185 may include at least one selected from the group consisting of silicon oxide, silicon nitride, and silicon oxynitride. The inorganic layer 185 may be formed by chemical vapor deposition (CVD), sputtering or evaporation.

An oxygen permeability of the barrier layer 180 used in the present exemplary embodiment may be 0.01 $cc/m^2/day$ or less, preferably, 0.001 $cc/m^2/day$ or less. Here, the oxygen permeability may be a value measured at a temperature of 35° C. and a relatively humidity of 0% using OX-TRAN 2/20 available from MOCON Company.

A water vapor permeability of the barrier layer 180 used in the present exemplary embodiment may be 0.1 $g/m^2/day$ or less, preferably, 0.01 $g/m^2/day$ or less. Here, the water vapor permeability may be a value measured at a temperature of 37.8° C. and a relatively humidity of 100% for 48 hours using PERMATRAN-W3/31 available from MOCON Company.

A thickness t1 of the organic layer 181 may be within a range from 0.01 to 0.5 μm, and a thickness t2 of the inorganic layer 182 may be within a range from 0.01 to 0.5 μm. That is, an entire thickness of the barrier layer 180 may be within a range from 0.02 to 2 μm. In an example, the thickness t1 of the organic layer may be greater than the thickness t2 of the inorganic layer.

As illustrated in FIGS. 9 and 10B, the barrier layer 180 may be disposed in a region except for the electrical connection structures 170 on the second surface of the connection member 140. The barrier layer 180 may be formed over an area equal to or greater than 50% of an area of the second surface of the connection member 140 except for the electrical connection structures 170 to expect a sufficient effect.

In the present exemplary embodiment, the connection member 140 may have a three-layer redistribution structure including a first wiring layer having first wiring patterns 142a and first vias 143a, a second wiring layer having second wiring patterns 142b and second vias 143b, and a third wiring layer having third wiring patterns 142c and third vias 143c.

In detail, the connection member 140 may include a first insulating layer 141a disposed on the core member 110 and a first surface of the semiconductor chip 120, first wiring patterns 142a disposed on the first insulating layer 141a, first vias 143a connecting the first insulating layer 141a and the connection pads 122 of the semiconductor chip 122 to each other, a second insulating layer 141b disposed on the first insulating layer 141a and covering the first wiring patterns 142a, second wiring patterns 142b disposed on the second insulating layer 141b, second vias 143b penetrating through the second insulating layer 141b and connecting the first and second wiring patterns 142a and 142b to each other, a third insulating layer 141c disposed on the second insulating layer 141b and covering the second wiring patterns 142b, third wiring patterns 142c disposed on the third insulating layer 141c, and third vias 143c penetrating through the third insulating layer 141c and electrically connecting the second and third wiring patterns 142b and 142c to each other.

The respective components included in the semiconductor package 100A according to the present exemplary embodiment will hereinafter be described in more detail.

The core member 110 may maintain rigidity of the semiconductor package 100A, and serve to secure uniformity of a thickness of the encapsulant 130. The redistribution layer 145 such as wiring patterns and vias may be introduced onto the core member 110. In this case, the semiconductor package 100A may be utilized as a package-on-package (POP) type fan-out package (see FIGS. 11 and 13). The semiconductor chip 120 may be disposed in the cavity 110H to be spaced apart from sidewalls of the core member 110 by a predetermined distance. Side surfaces of the semiconductor chip 120 may be surrounded by the core member 110. However, such a form is only an example and may be variously modified to have other forms, and the core member 110 may perform another function depending on such a form. In some exemplary embodiments, the core member 110 may be omitted.

The core member 110 may include an insulating layer. A material of the insulating layer may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. When a material having high rigidity, such as prepreg including a glass fiber, or the like, is used as the material of the insulating layer, the core member 110 may be utilized as a support member for controlling warpage of the semiconductor package 100A.

The semiconductor chip 120 may be an integrated circuit (IC) provided in an amount of several hundred to several million or more elements integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the abovementioned elements may also be combined with each other and be disposed.

The semiconductor chip 120 may be formed on the basis of an active wafer. In this case, a base material of a body 121 of the semiconductor chip 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions. The semiconductor chip 120 may be a bare die, a redistribution layer (not illustrated) may further be formed on the first surface (a surface on which the connection pads 122 are formed) of the semiconductor chip 120, and bumps (not illustrated), or the like, may be connected to the connection pads 122.

The encapsulant 130 may be provided in order to protect the core member 110 and an electronic component such as the semiconductor chip 120, and the like. An encapsulation form of the encapsulant 130 is not particularly limited, but may be a form in which the encapsulant 130 surrounds at least portions of the core member 110, the semiconductor chip 120, and the like. For example, the encapsulant 130 may cover an upper surface of the core member 110 and the semiconductor chip 120, and fill spaces between walls of the cavity 110H and the side surfaces of the semiconductor chip 120. In addition, the encapsulant 130 may also fill at least a portion of a space between the passivation layer 123 of the semiconductor chip 120 and the connection member 140. Meanwhile, the encapsulant 130 may fill the cavity 110H to thus serve as an adhesive and reduce buckling of the semiconductor chip 120 depending on certain materials.

For example, a thermosetting resin such as an epoxy resin, a thermoplastic resin such as a polyimide resin, a resin in which the thermosetting resin and the thermoplastic resin are mixed with an inorganic filler or are impregnated together with an inorganic filler in a core material such as a glass fiber, or the like, for example, prepreg, ABF, FR-4, BT, or the like, may be used as a material of the encapsulant 130. In some exemplary embodiments, a PID resin may also be used as the material of the encapsulant 130.

The connection member 140 may redistribute the connection pads 122 of the semiconductor chip 120. Several tens to several hundreds of connection pads 122 of the semiconductor chip 120 having various functions may be redistributed by the connection member 140, and may be physically or electrically externally connected through the electrical connection structures 170 depending on the functions.

The connection member 140 may be disposed on the core member 110 and the first surface of the semiconductor chip 120, and may have another multilayer redistribution structure, in addition to a three-layer wiring structure according to the present exemplary embodiment, and in some exemplary embodiments, a redistribution structure may include a single layer (that is, one wiring pattern+one via).

The insulating member 141 used in the connection member 140 may include the first to fourth insulating layers 141a, 141b, 141c, and 141d. The first to fourth insulating layers 141a, 141b, 141c, and 141d may be formed of a photosensitive insulating material such as a PID resin, in addition to the insulating material described above. When the first to fourth insulating layers 141a, 141b, 141c, and 141d have photosensitive properties, each of the first to fourth insulating layers 141a, 141b, 141c, and 141d may be formed to have a smaller thickness, and a fine pitch of each of the first to third vias 143a, 143b, and 143c may be achieved more easily. However, a water vapor permeability and/or an oxygen permeability may be relatively increased in accordance with a decrease in a thickness of each of the first to fourth insulating layers 141a, 141b, 141c, and 141d. Resultantly, a problem such as ion migration or generation of an oxide film may occur in the redistribution layer 145 that may be formed of a metal such as copper. In order to prevent this problem, the barrier layer 180 used in the present exemplary embodiment may decrease a bad influence due to oxygen, water vapor, and the like, permeated through the insulating member.

The first to fourth insulating layers 141a, 141b, 141c, and 141d may be photosensitive insulating layers including an insulating resin and an inorganic filler. For example, a content of inorganic filler in each of the insulating layers may be 10 wt % or less based on the insulating material. When the first to fourth insulating layers 141a, 141b, 141c, and 141d are multiple layers, the materials of the first to fourth insulating layers 141a, 141b, 141c, and 141d may be the same as each other, and may also be different from each other. The first to fourth insulating layers 141a, 141b, 141c, and 141d may be integrated with one another depending on a used process, such that boundaries thereamong may not be apparent.

A thickness of each of the first to fourth insulating layers 141a, 141b, 141c, and 141d between patterns except for the first to third wiring patterns 142a, 142b, and 142c may be approximately 1 μm to 10 μm.

The first to third wiring patterns 142a, 142b, and 142c may serve to redistribute the connection pads 122 together with the first to third vias 143a, 143b, and 143c. The first to third wiring patterns 142a, 142b, and 142c may include a conductive material such as copper (Cu), aluminum (Al), silver (Ag), tin (Sn), gold (Au), nickel (Ni), lead (Pb), titanium (Ti), or alloys thereof. The first to third wiring patterns 142a, 142b, and 142c may perform various functions depending on designs of corresponding layers. For example, the first to third wiring patterns 142a, 142b, and 142c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first to third wiring patterns 142a, 142b, and 142c may include via pad patterns, electrical connection structure pad patterns, and the like. Each of the first to third wiring patterns 142a, 142b, and 142c may have a thickness of about 0.5 μm to 15 μm.

The first to third vias 143a, 143b, and 143c may serve to connect the first to third wiring patterns 142a, 142b, and 142c, the connection pads 122, and the like, formed on different layers to each other in a vertical direction. Each of the first to third vias 143a, 143b, and 143c may include a conductive material such as copper (Cu), aluminum (Al), silver (Ag), tin (Sn), gold (Au), nickel (Ni), lead (Pb), titanium (Ti), or alloys thereof. Each of the first to third vias 143a, 143b, and 143c may be completely filled with the conductive material, or the conductive material may also be formed along a wall of each of via holes. In addition, each of the first to third vias 143a, 143b, and 143c may have any shape known in the related art, such as a tapered shape, a cylindrical shape, and the like.

In the present exemplary embodiment, a passivation layer for protecting the connection member 140 from external physical or chemical damage, or the like, may be omitted, and the barrier layer 180 may be introduced onto a surface of the fourth insulating layer 141d, which is the outermost layer on which the UBM layers 160 are formed, but the present exemplary embodiment is not limited thereto.

The UBM layers 160 may improve connection reliability of the electrical connection structures 170 to improve board level reliability of the semiconductor package 100A. The UBM layers 160 may be connected to the redistribution layer 145 of the connection member 140 exposed through openings h of the fourth insulating layer 141d. The UBM layers 160 may be formed in the openings h by any known metallization method using any known conductive material such as a metal, but are not limited thereto.

The electrical connection structures 170 may physically or electrically externally connect the semiconductor package 100A. For example, the semiconductor package 100A may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto. The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness.

Meanwhile, although not illustrated in the drawings, a metal thin film may be formed on the walls of the cavity 110H, if necessary, in order to dissipate heat or block electromagnetic waves. In some exemplary embodiments, a plurality of semiconductor chips 120 performing functions that are the same as or different from each other may be disposed in the cavity 110H, if necessary. In some exemplary embodiments, a separate passive component such as an inductor, a capacitor, or the like, may be disposed in the cavity 110H. In some exemplary embodiments, a passive component, for example, a surface mounting technology (SMT) component including an inductor, a capacitor, or the like, may be disposed on a surface of the passivation layer 150.

Figure 11:
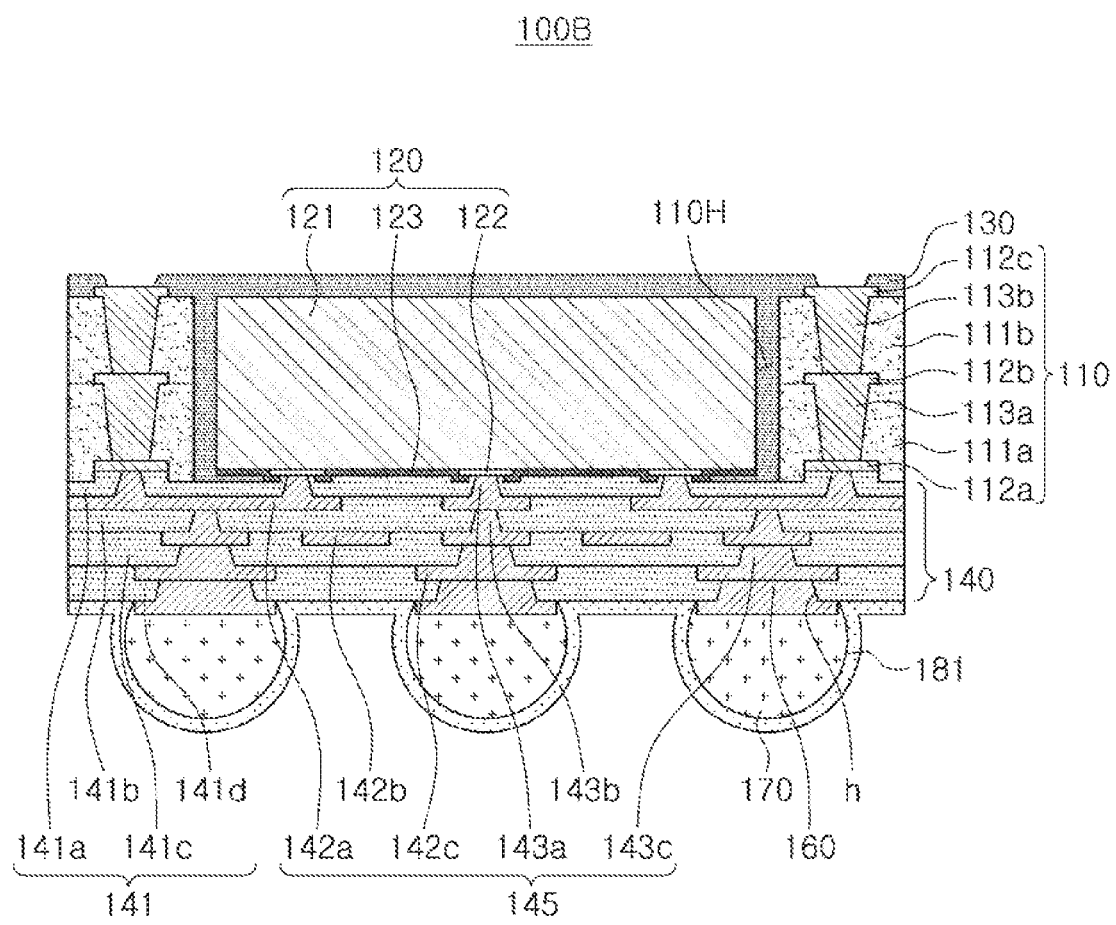
FIG. 11 is a side cross-sectional view illustrating a semiconductor package according to another exemplary embodiment in the present disclosure.

FIG. 11 is a side cross-sectional view illustrating a semiconductor package according to another exemplary embodiment in the present disclosure.

Referring to FIG. 11, it may be understood that a semiconductor package 100B according to the present exemplary embodiment has a structure similar to that illustrated in FIG. 9 except that it includes a core member 110 having a wiring structure and a barrier layer is formed up to surfaces of electrical connection structures as a single layer. Components according to the present exemplary embodiments may be understood with reference to the description for the same or similar components of the semiconductor package 100A illustrated in FIG. 9 unless explicitly described to the contrary.

In the present exemplary embodiment, the core member 110 may include a first dielectric layer 111a in contact with a connection member 140, a first wiring layer 112a in contact with the connection member 140 and embedded in the first dielectric layer 111a, a second wiring layer 112b disposed on the other surface of the first dielectric layer 111a opposing one surface of the first dielectric layer 111a in which the first wiring layer 112a is embedded, a second dielectric layer 111b disposed on the first dielectric layer 111a and covering the second wiring layer 112b, and a third wiring layer 112c disposed on the second dielectric layer 111b. The first to third wiring layers 112a, 112b, and 112c may be electrically connected to connection pads 122. The first and second wiring layers 112a and 112b and the second and third wiring layers 112b and 112c may be electrically connected to each other through first and second vias 113a and 113b penetrating through the first and second dielectric layers 111a and 111b, respectively.

When the first wiring layer 112a is embedded in the first dielectric layer 111a as in the present exemplary embodiment, a step generated due to a thickness of the first wiring layer 112a may be significantly reduced, and an insulating distance of the connection member 140 may thus become constant. That is, a difference between a distance from a first wiring pattern 142a of the connection member 140 to a lower surface of the first dielectric layer 111a and a distance from the first wiring pattern 142a of the connection member 140 to the connection pad 122 of a semiconductor chip 120 may be smaller than a thickness of the first wiring layer 112a. Therefore, a high density wiring design of the connection member 140 may be easy.

A lower surface of the first wiring layer 112a of the core member 110 may be disposed on a level above a lower surface of the connection pad 122 of the semiconductor chip 120. In addition, a distance between the first wiring pattern 142a of the connection member 140 and the first wiring layer 112a of the core member 110 may be greater than that between the first wiring pattern 142a of the connection member 140 and the connection pad 122 of the semiconductor chip 120. The reason is that the first wiring layer 112a may be recessed into the first dielectric layer 111a.

As described above, when the first wiring layer 112a is recessed into the first dielectric layer 111a, such that the lower surface of the first dielectric layer 111a and the lower surface of the first wiring layer 112a have a step therebetween, a phenomenon in which a material of an encapsulant 130 bleeds to pollute the first wiring layer 112a may be prevented. The second wiring layer 112b of the core member 110 may be disposed on a level between an active surface and an inactive surface of the semiconductor chip 120. The core member 110 may be formed at a thickness corresponding to that of the semiconductor chip 120. Therefore, the second wiring layer 112b formed in the core member 110 may be disposed on the level between the active surface and the inactive surface of the semiconductor chip 120.

Thicknesses of the first to third wiring layers 112a, 112b, and 112c of the core member 110 may be greater than those of wiring patterns 142a, 142b, and 142c of the connection member 140. Since the core member 110 may have a thickness equal to or greater than that of the semiconductor chip 120, the wiring layers 112a, 112b, and 112c may be formed to have large sizes depending on a scale of the core member 110. On the other hand, the first to third wiring patterns 142a, 142b, 142c of the connection member 140 may be formed to have sizes relatively smaller than those of the first to third wiring layers 112a, 112b, and 112c for thinness.

A material of each of the first and second dielectric layers 111a and 111b is not particularly limited, but may be, for example, a thermosetting resin such as an epoxy resin, a thermoplastic resin such as a polyimide resin, a resin in which the thermosetting resin and the thermoplastic resin are mixed with an inorganic filler or are impregnated together with an inorganic filler in a core material such as a glass fiber, or the like, for example, prepreg, ABF, FR-4, BT, or the like. In some exemplary embodiments, a PID resin may also be used as the material of each of the first and second dielectric layers 111a and 111b.

The first to third wiring layers 112a, 112b, and 112c may serve to redistribute the connection pads 122 of the semiconductor chip 120. For example, the first to third wiring layers 112a, 112b, and 112c may include copper (Cu), aluminum (Al), silver (Ag), tin (Sn), gold (Au), nickel (Ni), lead (Pb), titanium (Ti), or alloys thereof. The first to third wiring layers 112a, 112b, and 112c may perform various functions depending on designs of corresponding layers. For example, the first to third wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the first to third wiring layers 112a, 112b, and 112c may include via pads, wire pads, electrical connection structure pads, and the like.

The first and second vias 113a and 113b may electrically connect the first to third wiring layers 112a, 112b, and 112c formed on different layers to each other, resulting in an electrical path in the core member 110. A material of each of the first and second vias 113a and 113b may be a conductive material.

Each of the first and second vias 113a and 113b may be completely filled with the conductive material, or the conductive material may also be formed along a wall of each of via holes. In addition, each of the first and second vias 113a and 113b may have any shape known in the related art, such as a tapered shape, a cylindrical shape, and the like. When holes for the first vias 113a are formed, some of the pads of the first wiring layer 112a may serve as a stopper. It may be advantageous in a process that each of the first vias 113a has the tapered shape of which a width of an upper surface is greater than that of a lower surface. In this case, the first vias 113a may be integrated with pad patterns of the second wiring layer 112b. In addition, when holes for the second vias 113b are formed, some of the pads of the second wiring layer 112b may serve as a stopper, and it may thus be advantageous in a process that each of the second vias 113b has the tapered shape of which a width of an upper surface is greater than that of a lower surface. In this case, the second vias 113b may be integrated with pad patterns of the third wiring layer 112c.

A barrier layer 181 used in the present exemplary embodiment may have a single-layer structure unlike the abovementioned exemplary embodiment, and when the barrier layer 181 has the single-layer structure, the barrier layer 181 may be an organic barrier layer 181 containing fluorine.

For example, the organic barrier layer 181 containing the fluorine may include at least one selected from the group consisting of $CF_4$, $C_4F_8$, and fluoroalkyl silane. The fluoroalkyl silane usable as a material of the organic barrier layer 181 may include fluoroalkyl silane having one or more fluorine atoms and about 1 to about 12 carbon atoms, but is not limited thereto. In another example, the organic barrier layer 181 may include perylene.

Unlike the abovementioned exemplary embodiment, the organic barrier layer 181 may be formed on a second surface of the connection member to cover the surfaces of the electrical connection structures 170. A process of forming the organic barrier layer 181 may be performed after the electrical connection structures 170 are formed.

In the present exemplary embodiment, even though the organic barrier layer 181 is formed of an insulating material, portions of the organic barrier layer 181 disposed on the electrical connection structures 170 may be thermally decomposed in a reflow process by controlling a thickness of the organic barrier layer 181.

Figure 12A:
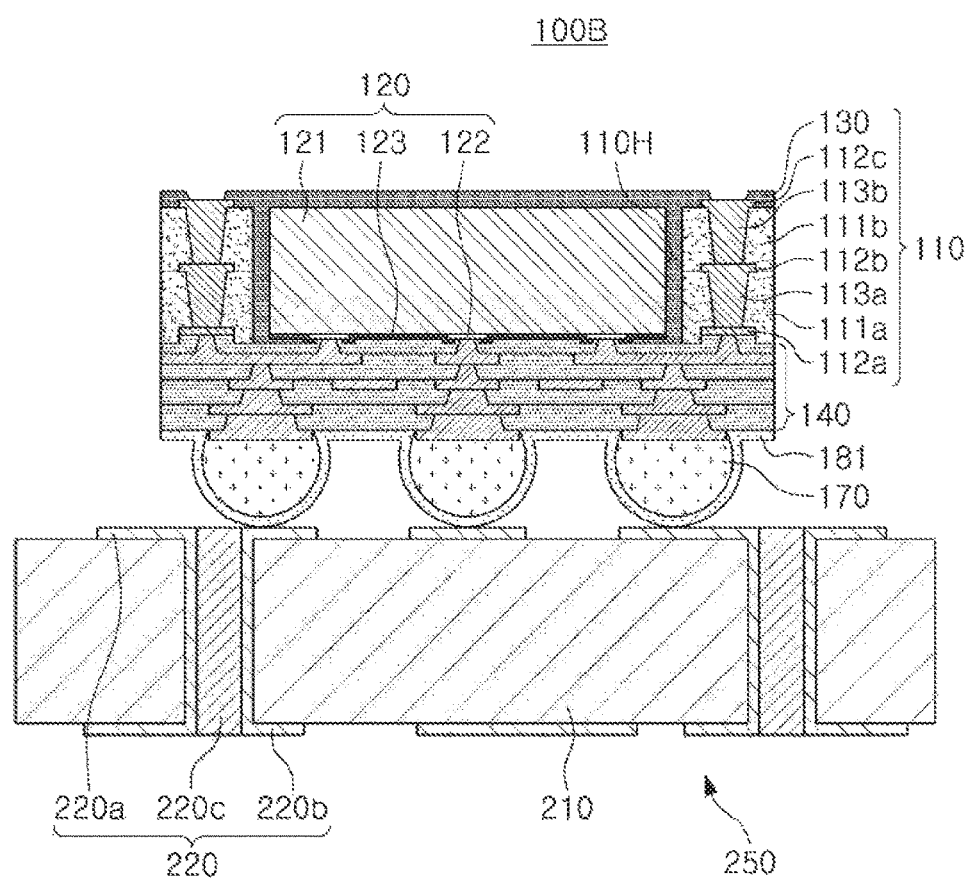
FIGS. 12A and 12B are cross-sectional views for describing a process of mounting the semiconductor package illustrated in FIG. 11.
Figure 12B:
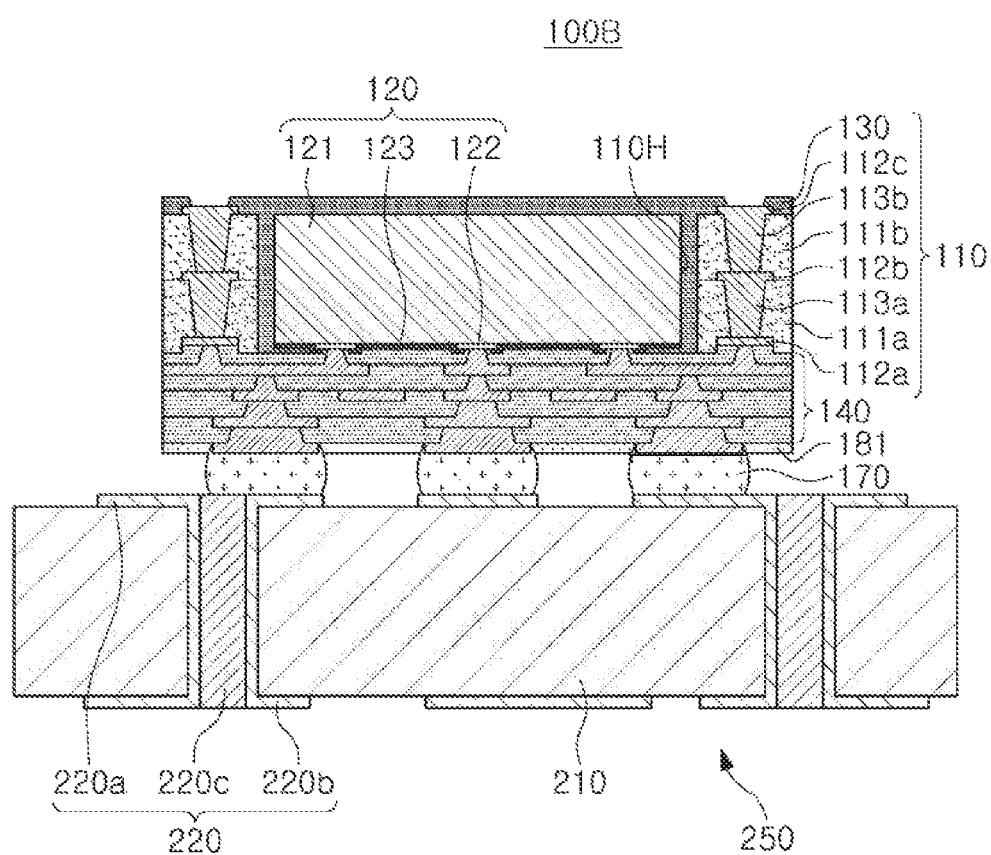

FIGS. 12A and 12B are cross-sectional views for describing a process of mounting the semiconductor package illustrated in FIG. 11 on a mainboard.

First, as illustrated in FIG. 12A, the semiconductor package 100B according to the present exemplary embodiment may be mounted on a mainboard 250 of an electronic device so that the electrical connection structures 170 are connected to circuit patterns 220. The circuit patterns 220 may include first and second patterns 220a and 220b disposed on upper and lower surfaces of a board body 210, respectively, and conductive vias 220c connecting the first and second patterns 220a and 220b to each other. The organic barrier layer 181 may be formed on a lower surface of the connection member 140, and extend to the surfaces of the electrical connection structures 170 disposed on the circuit patterns 220.

Then, as illustrated in FIG. 12B, a reflow process may be performed. In the reflow process, the electronic connection structures 170 may be melted and attached to the first patterns 220a, and in such a melting process, the organic barrier layer 181 existing on the surfaces of the electrical connection structures 170 may be thermally decomposed and removed. On the other hand, the organic barrier layer 181 may still remain on the lower surface of the connection member 140 to effectively prevent oxygen and/or water vapor from permeating into the connection member 140.

The organic barrier layer 181 used in the present exemplary embodiment may be formed at a thickness of 0.2 μm or less so that the organic barrier layer 181 existing on the surfaces of the electrical connection structures 170 is effectively removed and an influence by a residue is not generated. Meanwhile, the organic barrier layer 181 remaining on the lower surface of the connection member 140 may be formed at a thickness of 0.02 μm or more in order to maintain resistance to oxygen and/or water vapor.

Figure 13:
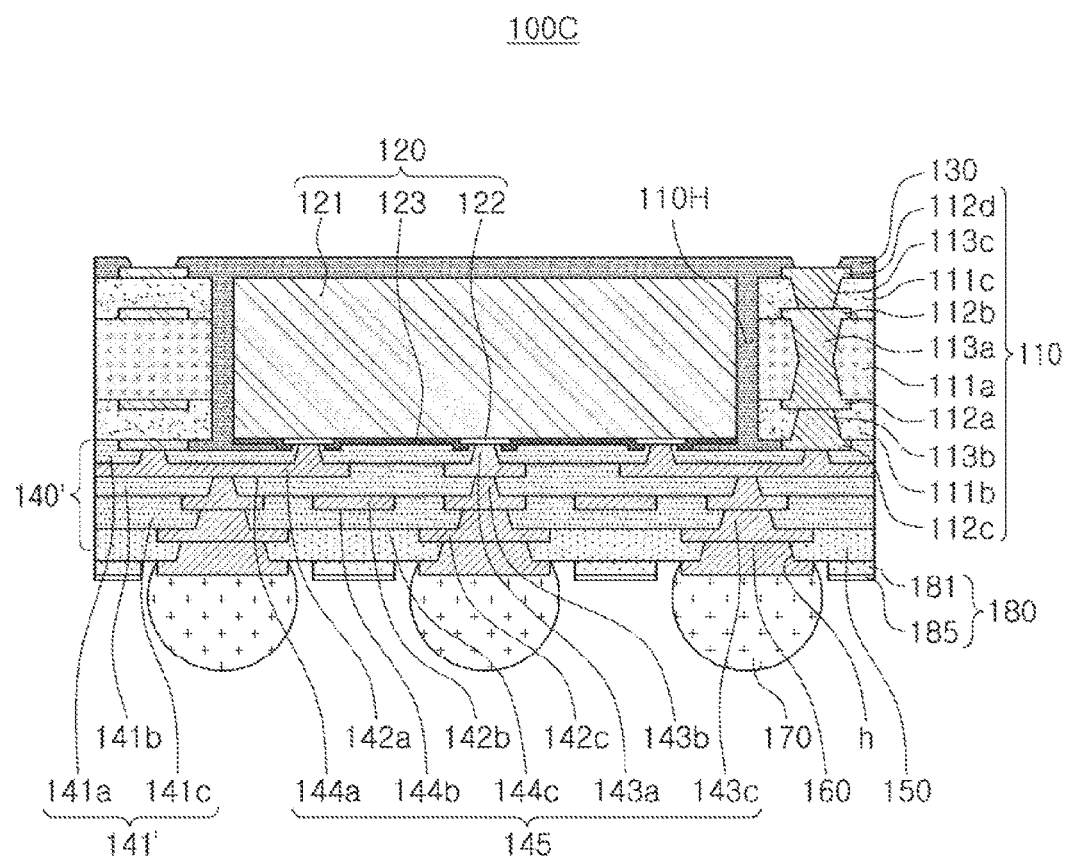
FIG. 13 is a side cross-sectional view illustrating a semiconductor package according to another exemplary embodiment in the present disclosure.

FIG. 13 is a schematic cross-sectional view illustrating a semiconductor package according to another exemplary embodiment in the present disclosure.

Referring to FIG. 13, it may be understood that a semiconductor package 100C according to the present exemplary embodiment has a structure similar to that illustrated in FIG. 9 except that a core member 110 having a wiring structure is used and a passivation layer 150 is formed on a lower surface of a connection member 140. Components according to the present exemplary embodiments may be understood with reference to the description for the same or similar components of the semiconductor package 100A illustrated in FIG. 9 unless explicitly described to the contrary.

In the semiconductor package 100C according to the present exemplary embodiment, the core member 110 may include a first dielectric layer 111a, a first wiring layer 112a and a second wiring layer 112b disposed on opposite surfaces of the first dielectric layer 111a, respectively, a second dielectric layer 111b disposed on the first dielectric layer 111a and covering the first wiring layer 112a, a third wiring layer 112c disposed on the second dielectric layer 111b, a third dielectric layer 111c disposed on the first dielectric layer 111a and covering the second wiring layer 112b, and a fourth wiring layer 112d disposed on the third dielectric layer 111c. The first to fourth wiring layers 112a, 112b, 112c, and 112d may be electrically connected to connection pads 122.

Since the core member 110 may include a large number of wiring layers 112a, 112b, 112c, and 112d, a connection member 140 may further be simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first to third vias 113a, 113b, and 113c each penetrating through the first to third dielectric layers 111a, 111b, and 111c.

The first dielectric layer 111a may have a thickness greater than those of the second dielectric layer 111b and the third dielectric layer 111c. The first dielectric layer 111a may be basically relatively thick in order to maintain rigidity, and the second dielectric layer 111b and the third dielectric layer 111c may be introduced in order to form a larger number of wiring layers 112c and 112d. The first dielectric layer 111a may include an insulating material different from those of the second dielectric layer 111b and the third dielectric layer 111c. For example, the first dielectric layer 111a may be, for example, prepreg including a core material, a filler, and an insulating resin, and the second dielectric layer 111b and the third dielectric layer 111c may be an ABF or a PID film including a filler and an insulating resin. However, the materials of the first dielectric layer 111a and the second and third dielectric layers 111b and 111c are not limited thereto. Similarly, a first via 113a penetrating through the first dielectric layer 111a may have a diameter greater than those of a second via 113b and a third via 113c each penetrating through the second dielectric layer 111b and the third dielectric layer 111c.

A lower surface of the third wiring layer 112c of the core member 110 may be disposed on a level below a lower surface of the connection pad 122 of a semiconductor chip 120. In addition, a distance between a first wiring pattern 142a of the connection member 140 and the third wiring layer 112c of the core member 110 may be smaller than that between the first wiring pattern 142a of the connection member 140 and the connection pad 122 of the semiconductor chip 120.

The reason is that the third wiring layer 112c may be disposed on the second dielectric layer 111b in a protruding form, resulting in being in contact with the connection member 140. The first wiring layer 112a and the second wiring layer 112b of the core member 110 may be disposed on a level between an active surface and an inactive surface of the semiconductor chip 120. Since the core member 110 may be formed at a thickness corresponding to that of the semiconductor chip 120, the first wiring layer 112a and the second wiring layer 112b formed in the core member 110 may be disposed on the level between the active surface and the inactive surface of the semiconductor chip 120.

Thicknesses of the first to fourth wiring layers 112a, 112b, 112c, and 112d of the core member 110 may be greater than those of first to third wiring patterns 142a, 142b, and 142c of the connection member 140. Since the core member 110 may have a thickness equal to or greater than that of the semiconductor chip 120, the first to fourth wiring layers 112a, 112b, 112c, and 112d may also be formed to have large sizes. On the other hand, the first to third wiring patterns 142a, 142b, and 142c of the connection member 140 may be formed to have relatively small sizes for thinness.

The connection member 140' used in the present exemplary embodiment may further include the passivation layer 150 disposed on a lower surface of an insulating member 141' and partially embedding UBM layers 160 therein.

The passivation layer 150 may protect the semiconductor chip from external physical or chemical damage. The passivation layer 150 may have openings h exposing at least portions of the first to third wiring patterns 142a, 142b, and 142c of the connection member 140'. The number of openings h formed in the passivation layer 150 may be several tens to several thousands. For example, the passivation layer 150 may include at least one of prepreg, ABF, FR-4, BT, and a solder resist.

A barrier layer 180 used in the present exemplary embodiment may have a multilayer structure, similar to the barrier layer illustrated in FIG. 9, and may be disposed on the passivation layer 150.

The barrier layer 180 may have a multilayer barrier structure including an organic layer 181 and an inorganic layer 185 disposed on the organic layer 181. The organic layer 181 may be formed of an organic material containing fluorine. For example, the organic layer 181 containing the fluorine may include at least one selected from the group consisting of $CF_4$, $C_4F_8$, and fluoroalkyl silane. For example, the inorganic layer 185 may include at least one selected from the group consisting of silicon oxide, silicon nitride, and silicon oxynitride. An oxygen permeability of the barrier layer 180 used in the present exemplary embodiment may be 0.01 $cc/m^2$/day or less, preferably, 0.001 $cc/m^2$/day or less, and a water vapor permeability of the barrier layer 180 used in the present exemplary embodiment may be 0.1 $g/m^2$/day or less, preferably, 0.01 $g/m^2$/day or less.

A thickness t1 of the organic layer 181 may be in a range of 0.01 to 0.5 μm, and a thickness t2 of the inorganic layer 182 may be in a range of 0.01 to 0.5 μm. That is, an entire thickness of the barrier layer 180 may be in a range of 0.02 to 2 μm. In an example, the thickness t1 of the organic layer may be greater than the thickness t2 of the inorganic layer.

The UBM layers 160 may be connected to the third wiring patterns 143c of the connection member 140' exposed through the openings h of the passivation layer 150. The UBM layers 160 may be formed in the openings h of the passivation layer 150 by any known metallization method using any known conductive metal such as a metal, but is not limited thereto.

As set forth above, according to the exemplary embodiments in the present disclosure, a semiconductor package in which a reliability decrease problem due to permeation of oxygen or gas may be solved and excellent reliability may be maintained in a high-temperature/high-humidity environment by introducing an organic barrier layer or organic/inorganic barrier layers containing fluorine onto a surface of an insulating member may be provided.

While exemplary embodiments have been shown and described above, it will be apparent to those skilled in the art that modifications and variations could be made without departing from the scope of the present invention as defined by the appended claims.

What is claimed is:
1. A semiconductor package comprising:
a semiconductor chip having connection pads;

a connection member having a first surface on which the semiconductor chip is disposed and a second surface opposing the first surface, and including an insulating member and a redistribution layer disposed in the insulating member to be electrically connected to the connection pads;

an encapsulant disposed on the first surface of the connection member and encapsulating the semiconductor chip;

an organic barrier layer disposed as an outermost layer on the second surface of the connection member and including an organic material containing fluorine;

electrical connection structures disposed on the second surface of the connection member; and underbump metallurgy (UBM) layers connecting the electrical connection structures and the redistribution layer to each other, wherein the organic barrier layer covers surfaces of the electrical connection structures, and a thickness of the organic barrier layer is 0.2 µm or less.

2. The semiconductor package of claim 1, wherein the organic material includes at least one selected from the group consisting of $CF_4$, $C_4F_8$, and fluoroalkyl silane.

3. The semiconductor package of claim 1, wherein the thickness of the organic barrier layer is 0.02 µm or greater.

4. The semiconductor package of claim 1, wherein the insulating member is formed of a photosensitive organic material.

5. The semiconductor package of claim 1, further comprising a core member disposed on the first surface of the connection member and having a cavity in which the semiconductor chip is accommodated.

6. The semiconductor package of claim 5, wherein the core member has a wiring structure connecting upper and lower surfaces of the core member to each other and electrically connected to the redistribution layer.

7. The semiconductor package of claim 1, wherein the organic material further comprises perylene.

8. A semiconductor package comprising:
a semiconductor chip having connection pads;
a connection member having a first surface on which the semiconductor chip is disposed and a second surface opposing the first surface and including an insulating member, a redistribution layer disposed in the insulating member to be electrically connected to the connection pads, and UBM layers electrically connected to the redistribution layer and providing connection regions on the second surface;

an encapsulant disposed on the first surface of the connection member and encapsulating the semiconductor chip;

electrical connection structures disposed on the second surface of the connection member and connected to the connection regions of the UBM layers; and a multilayer barrier having an organic layer disposed on the second surface of the connection member and an inorganic layer disposed as an outermost layer on the organic layer.

9. The semiconductor package of claim 8, wherein the organic layer is an organic layer containing fluorine, and
the inorganic layer includes at least one selected from the group consisting of silicon oxide, silicon nitride, and silicon oxynitride.

10. The semiconductor package of claim 8, wherein an oxygen permeability of the multilayer barrier is 0.01 cc/m²/day or less.

11. The semiconductor package of claim 8, wherein a water vapor permeability of the multilayer barrier is 0.1 g/m²/day or less.

12. The semiconductor package of claim 9, wherein the organic layer includes an organic material satisfying R—Si—$F_xC_y$OH, where R is an alkyl, fluoroalkyl, acryl, methacryl, vinyl, epoxy, amine, or aniline group.

13. The semiconductor package of claim 8, wherein a thickness of the organic layer is within a range from 0.01 to 0.5 µm, inclusive, and
a thickness of the inorganic layer is within a range from 0.01 to 0.5 µm, inclusive.

14. The semiconductor package of claim 8, wherein a thickness of the organic layer is greater than a thickness of the inorganic layer.

* * * * *